United States Patent
Isshiki et al.

(10) Patent No.: US 6,379,792 B1
(45) Date of Patent: Apr. 30, 2002

(54) SILICONE ADHESIVE SHEET AND METHOD FOR MANUFACTURING

(75) Inventors: Minoru Isshiki; Kimio Yamakawa; Yoshito Ushio; Ryoto Shima; Katsutoshi Mine, all of Chiba Prefecture (JP)

(73) Assignee: Dow Corning Toray Silicone Co., Ltd., Tokyo (JP)

( * ) Notice: Subject to any disclaimer, the term of this patent is extended or adjusted under 35 U.S.C. 154(b) by 0 days.

(21) Appl. No.: 09/611,204

(22) Filed: Jul. 6, 2000

(30) Foreign Application Priority Data

Jul. 9, 1999 (JP) .......................................... 11-195301

(51) Int. Cl.[7] ............................. B32B 27/18; B32B 9/04

(52) U.S. Cl. ................................. 428/355 R; 428/41.7; 428/41.8; 428/68; 428/447; 428/448; 428/343; 524/262; 524/265; 524/588; 528/34; 528/38; 438/48; 156/327

(58) Field of Search ..................... 528/34, 36; 524/588, 524/262, 265; 428/41.7, 41.8, 68, 447, 448, 343, 355 R; 156/329; 438/48

(56) References Cited

U.S. PATENT DOCUMENTS

| 5,936,110 A | * | 8/1999 | Yoshitake et al. | .......... 556/408 |
| 5,945,555 A | * | 8/1999 | Yoshitake | .................. 556/408 |
| 6,235,862 B1 | * | 5/2001 | Isshiki et al. | ................. 528/15 |

FOREIGN PATENT DOCUMENTS

| EP | 0 908 462 A | 4/1999 | .............. C09J/7/02 |
| JP | 11-012546 | 1/1999 | ........... H01L/21/58 |

* cited by examiner

*Primary Examiner*—Robert Dawson
*Assistant Examiner*—Jeffrey B Robertson
(74) *Attorney, Agent, or Firm*—Larry A. Milco; Catherine U. Brown (57) ABSTRACT

A silicone adhesive sheet for bonding a semiconductor chip to a chip attachment component comprising a crosslinkable silicone composition containing a silatrane derivative, and a method for manufacturing a silicone adhesive sheet by subjecting a crosslinkable silicone composition containing a silatrane derivative to a crosslinking reaction between backing materials that do not stick to the crosslinked product of said composition, where at least one of the backing materials has a larger dielectric constant than that of the crosslinked product. The present silicone adhesive sheet allows a semiconductor chip and a chip attachment component to be bonded in a short time at a relatively low temperature.

14 Claims, 1 Drawing Sheet

SILICONE ADHESIVE SHEET AND METHOD FOR MANUFACTURING

BACKGROUND OF INVENTION

The present invention relates to a silicone adhesive sheet and a method for manufacturing, and more particularly relates to a silicone adhesive sheet with which a semiconductor chip and a chip attachment component can be bonded in a short time at a relatively low temperature, and to a method for efficiently manufacturing this sheet.

The use of a silicone adhesive sheet composed of a crosslinked product of a crosslinkable silicone composition to bond a semiconductor chip to an attachment component for that chip has been proposed in Japanese Laid-Open Patent Application H11-12546. A problem with a silicone adhesive sheet such as this, however, is that when the semiconductor chip is bonded to the chip attachment component via this sheet, adhesion will be inadequate unless the components are heated for an extended period at a relatively high temperature, and this carries with it the danger of damaging the semiconductor chip.

It is an object of the present invention to provide a silicone adhesive sheet with which a semiconductor chip and a chip attachment component can be bonded in a short time at a relatively low temperature, and a method for efficiently manufacturing this sheet.

SUMMARY OF INVENTION

A first embodiment of the present invention is a silicone adhesive sheet used to bond a semiconductor chip to a chip attachment component, the adhesive comprising the crosslinked product of a crosslinkable silicone composition containing a silatrane derivative. A second embodiment of the present invention is a method for manufacturing a silicone adhesive sheet for bonding a semiconductor chip to a chip attachment component, and is characterized in that at least one of the backing materials has a larger dielectric constant than that of the crosslinked product when a crosslinkable silicone composition containing a silatrane derivative is subjected to a crosslinking reaction between backing materials that do not stick to the crosslinked product of the composition.

KEY

1 semiconductor chip
2 silicone adhesive sheet
3 chip attachment component (circuit board made of glass fiber-reinforced epoxy resin)
4 circuit wiring
5 bonding wire
6 sealing resin
7 chip attachment component (circuit board made of polyimide resin)
8 bump
9 sealant/filler

DESCRIPTION OF INVENTION

A first embodiment of the present invention is a silicone adhesive sheet used to bond a semiconductor chip to a chip attachment component, the adhesive comprising the crosslinked product of a crosslinkable silicone composition containing a silatrane derivative. A second embodiment of the present invention is a method for manufacturing a silicone adhesive sheet for bonding a semiconductor chip to a chip attachment component, and is characterized in that at least one of the backing materials has a larger dielectric constant than that of the crosslinked product when a crosslinkable silicone composition containing a silatrane derivative is subjected to a crosslinking reaction between backing materials that do not stick to the crosslinked product of the composition.

First, the silicone adhesive sheet of the present invention will be described in detail. The silicone adhesive sheet of the present invention is used to bond a semiconductor chip to a chip attachment component, and is characterized in that at least the sides touching the semiconductor chip and the chip attachment component are formed from the crosslinked product of a crosslinkable silicone composition containing a silatrane derivative, and is further characterized in that the sides touching the semiconductor chip and the chip attachment component are formed from the crosslinked product of a crosslinkable silicone composition containing a silatrane derivative, and the interior may be formed from a silicone rubber member. "Crosslinked product" as used here means that the crosslinkable silicone composition has undergone a crosslinking reaction and has been converted into the form of a gel or rubber, but there are no particular restrictions on the degree of this crosslinking. The silicone adhesive sheet of the present invention may be formed from just the crosslinked product of this crosslinkable silicone composition, or just the sides touching the semiconductor chip and the chip attachment component may be formed from this crosslinked product, and the interior formed from a silicone rubber member. With the latter silicone adhesive sheet, examples of the silicone rubber member on the inside include a silicone rubber sheet and silicone rubber particles. The shape of these silicone adhesive sheets is not limited, but for practical purposes the thickness thereof should be between 1 and 5000 μm, and a range of 10 to 1000 μm is particularly favorable.

The present silicone adhesive sheet is characterized in that at least the sides touching the semiconductor chip and the chip attachment component are formed from the crosslinked product of a crosslinkable silicone composition containing a silatrane derivative, and it is preferable for this silatrane derivative to be a compound described by the following general formula.

In the above formula, each $R^1$ are independently selected from the group consisting of a hydrogen atom and an alkyl group. Examples of the alkyl group of $R^1$ include methyl, ethyl, propyl, butyl, pentyl, isopropyl, isobutyl, cyclopentyl, and cyclohexyl. A hydrogen atom or a methyl group is particularly favorable as $R^1$. Each $R^2$ in the above formula is independently selected from the group consisting of a hydrogen atom, alkyl groups, and alkoxysilyl-containing organic groups described by formula $—R^4—Si(OR^5)_xR^6_{(3-x)}$. At least one of the $R^2$ groups is one of these alkoxysilyl-containing organic groups. Examples of the alkyl group represented by $R^2$ are the same as given for $R^1$. When $R^2$ is an alkoxysilyl-containing organic group, $R^4$ in the above formula is a divalent organic group, examples of which include methylene, ethylene, methylmethylene, propylene, methylethylene, butylene, hexylene, 1-methylpentylene, 1,4-dimethylbutylene, and other such alkylene groups; and an alkyleneoxyalkylene group such as methyleneoxypropylene and methyleneoxybutylene. Ethylene, propylene, butylene, methyleneoxypropylene, and methyleneoxypentylene is preferred. $R^5$ in the above formula is a $C_1$ to $C_{10}$ alkyl group, examples of which are the same as given for $R^1$, with methyl or ethyl being preferred. $R^6$ in the above formula is a substituted or unsubstituted monovalent hydrocarbon group, examples of which include methyl, ethyl, propyl, butyl, pentyl, isopropyl, isobutyl, cyclopentyl, cyclohexyl, and other alkyl groups; aryl groups such as phenyl, tolyl, xylyl, and naphthyl; alkenyl groups such as vinyl, allyl, butenyl, pentenyl, and hexenyl; aralkyl groups such as benzyl and phenethyl; and halogenated alkyl groups such as chloromethyl, 3-chloropropyl, 3,3,3-trifluoropropyl, and nonafluorobutylethyl. The methyl group is preferred. Subscript x in the above formula is 1, 2, or 3, and preferably 3.

The following are examples of the alkoxysilyl-containing organic group represented by $R^2$.

—$(CH_2)_2Si(OCH_3)_3$
—$(CH_2)_2Si(OCH_3)_2CH_3$
—$(CH_2)_3Si(OC_2H_5)_3$
—$(CH_2)_3Si(OC_2H_5)(CH_3)_2$
—$(CH_2O(CH_2)_3Si(OCH_3)_3$
—$(CH_2O(CH_2)_3Si(OC_2H_5)_3$
—$(CH_2O(CH_2)_3Si(OCH_3)_2CH_3$
—$(CH_2O(CH_2)_3Si(OC_2H_5)_2CH_3$
—$(CH_2OCH_2Si(OCH_3)_3$
—$(CH_2OCH_2Si(OCH_3)(CH_3)_2$

$R^3$ in the above formula is selected from the group consisting of substituted and unsubstituted monovalent hydrocarbon groups, $C_1$ to $C_{10}$ alkoxy groups, glycidoxyalkyl groups, oxiranylalkyl groups, and acyloxyalkyl groups. Examples of the alkoxy groups represented by $R^3$ include methoxy, ethoxy, and propoxy; examples of the glycidoxyalkyl groups represented by $R^3$ include 3-glycidoxypropyl; examples of the oxiranylalkyl groups represented by $R^3$ include 4-oxiranylbutyl and 8-oxiranyloctyl, and examples of the acyloxyalkyl group represented by $R^3$ include acetoxypropyl and 3-methylacryloxypropyl. It is particularly favorable for $R^3$ to be an alkenyl group or alkoxy group, and an alkenyl group is preferred.

Examples of suitable silatrane derivatives are shown at pages 6 to 14 herein.

-continued

The following are two examples of a method for manufacturing this silatrane derivative.

(1) An epoxy-containing trialkoxysilane compound described by formula:

where each $R^1$ is independently selected from the group consisting of a hydrogen atom and an alkyl group; $R_4$ is a divalent organic group; and $R_7$ is a $C^1$ to $C^{10}$ alkyl group, is reacted with ammonia or an amine compound described by formula:

$$NH_y(CR^1{}_2CR^1{}_2OH)_{(3-y)}$$

where each $R^1$ is independently selected from the group consisting of a hydrogen atom and an alkyl group; and y is 1 or 2.

(2) An epoxy-containing alkoxysilane compound described by formula:

where each $R^1$ is independently selected from the group consisting of a hydrogen atom and an alkyl group; $R^4$ is a divalent organic group; $R^6$ is a substituted or unsubstituted monovalent hydrocarbon group; $R^7$ is a $C_1$ to $C_{10}$ alkyl group; and x is 1, 2, or 3; and an alkoxysilane compound described by formula:

$$R^8Si(OR^9)_3$$

where each $R^8$ is independently selected from the group consisting of substituted and unsubstituted monovalent hydrocarbon groups, $C_1$ to $C_{10}$ alkoxy groups, acyloxyalkyl groups, and aminoalkyl groups; and $R^9$ is a $C_1$ to $C_{10}$ alkyl group are reacted with ammonia or an amine compound described by formula:

$$NH_y(CR^1{}_2CR^1{}_2OH)_{(3-y)}$$

where each $R^1$ is independently selected from the group consisting of a hydrogen atom and an alkyl group; and y is 1 or 2.

With these methods, it is believed that the ammonia or amine compound brings about an epoxy group ring cleavage reaction, and a silatrane structure is formed through a cyclization reaction brought about by an alkoxy group exchange reaction between the hydroxyl groups produced by this ring cleavage reaction or the hydroxyl groups in the amine compound and the silicon atom-bonded alkoxy groups in the alkoxysilane.

In the first manufacturing method, examples of the epoxy-containing trialkoxysilane compound include 4-oxiranylbutyltrimethoxysilane, 8-oxiranyloctyltrimethoxysilane, 3-glycidoxypropyltrimethoxysilane, 3-glycidoxypropyltriethoxysilane, glycidoxymethyltrimethoxysilane, and glycidoxymethyltriethoxysilane. Examples of the amine compound include 2-hydroxyethylamine, 2,2'-dihydroxyethylamine, and 2-hydroxy-2-methyl-ethylamine.

In the first manufacturing method, there are no restrictions on the amount in which the epoxy-containing trialkoxysilane compound is added with respect to the ammonia, but to minimize by-products and obtain a silatrane derivative at a better yield, if the reaction is conducted under conditions in which the ammonia is not lost through evaporation, then this epoxy-containing trialkoxysilane compound should be used in an amount of 3 to 30 mol, and preferably 4 to 20 mol, per mole of ammonia. There are no restrictions on the amount in which the epoxy-containing trialkoxysilane compound is added with respect to the amine compound in the manufacturing method, but to minimize by-products and obtain a silatrane derivative at a better yield, if y is 1 in the amine compound, then this epoxy-containing trialkoxysilane compound should be used in an amount of 1.5 to 10 mol, and preferably 2 to 5 mol, per mole of amine compound, but if y is 2 in the amine compound, then the epoxy-containing trialkoxysilane compound should be used in an amount of 2.5 to 20 mol, and preferably 3 to 10 mol.

In the second manufacturing method, examples of the epoxy-containing alkoxysilane compound include 4-oxiranylbutyltrimethoxysilane, 4-oxiranylbutylmethyldimethoxysilane, 8-oxiranyloctyltrimethoxysilane, 3-glycidoxypropyltrimethoxysilane, 3-glycidoxypropyltriethoxysilane, 3-glycidoxypropylmethyldimethoxysilane, 3-glycidoxypropylmethyldiethoxysilane, glycidoxymethyltrimethoxysilane, glycidoxymethylmethyldimethoxysilane, and glycidoxymethyltriethoxysilane. Examples of amine compounds are the same as the compounds listed above. Examples of alkoxysilane compounds include tetramethoxysilane, tetraethoxysilane, methyltrimethoxysilane, methyltriethoxysilane, vinyltrimethoxysilane, vinyltriethoxysilane, phenyltrimethoxysilane, and 3-methacryloxypropylmethoxysilane.

In the second manufacturing method, there are no restrictions on the amount in which the epoxy-containing alkoxysilane compound is added with respect to the ammonia, but to minimize by-products and obtain a silatrane derivative at a better yield, if the reaction is conducted under conditions in which the ammonia is not lost through evaporation, then this epoxy-containing alkoxysilane compound should be used in an amount of 2 to 20 mol, and preferably 3 to 15 mol, per mole of ammonia. The amount in which the alkoxysilane compound is added should be 0.5 to 50 mol, and preferably 1 to 20 mol, per mole of ammonia. There are no restrictions on the amount in which the epoxy-containing alkoxysilane compound is added with respect to the amine compound in the second manufacturing method, but to minimize by-products and obtain a silatrane derivative at a better yield, if y is 1 in the amine compound, then this epoxy-containing alkoxysilane compound should be used in an amount of 0.5 to 10 mol, and preferably 0.8 to 5 mol, per mole of amine compound, but if y is 2 in the amine compound, then the epoxy-containing alkoxysilane compound should be used in an amount of 1.5 to 20 mol, and preferably 1.8 to 10 mol. The amount in which the alkoxysilane compound is added should be 0.5 to 50 mol, and preferably 1 to 20 mol, per mole of amine compound.

With methods such as these for manufacturing a silatrane derivative, the reaction will proceed either at normal temperature or under heating, but heating at 100° C. or lower is preferable so that the reaction will not take as long. The use of an organic solvent is optional in the above manufacturing methods, and examples of organic solvents that can be used include hexane, heptane, octane, and other aliphatic hydrocarbons; toluene, xylene, and other aromatic hydrocarbons; methanol, ethanol, isopropanol, and other alcohols; acetone, methyl isobutyl ketone, and other ketones; diethyl ether, tetrahydrofuran, and other ethers; ethyl acetate, isoamyl acetate, and other esters; and dimethylformamide, dimethylacetamide, and other amide compounds. In particular, the use of methanol, ethanol, or another such alcohol will shorten the reaction time and allow the targeted silatrane derivative to be obtained at a higher yield. When an alcohol is added in the above manufacturing methods, in order to bring about an alkoxy exchange reaction with the silicon atom-bonded alkoxy groups during this reaction, it is preferable for this alcohol to be one with the same number of carbon atoms as the silicon atom-bonded alkoxy groups in the epoxy-containing trialkoxysilane compound or in the epoxy-containing alkoxysilane compound and the alkoxysilane compound. Also, when an alcohol is added in the above manufacturing methods, the reaction can be shortened considerably by conducting it at the reflux temperature of this alcohol, and this also raises the yield of the resulting silatrane derivative.

There are no restrictions on the amount in which the silatrane derivative is contained in the crosslinkable silicone composition, but it is preferable for the amount to be 0.01 to 20 weight parts per 100 weight parts of silicone polymer that is the main component in the crosslinkable silicone composition, with a range of 0.1 to 10 weight parts being particularly favorable. This is because the adhesiveness of the crosslinked product will tend to be lower if the amount in which this silatrane derivative is contained is below the lower limit of the above range, whereas exceeding the upper limit of the range will not further increase adhesiveness, and will actually tend to lower the stability of the silicone adhesive sheet.

Examples of the crosslinkable silicone composition containing this silatrane derivative include one that is crosslinked by a hydrosilylation reaction, one that is crosslinked by a condensation reaction, one that is crosslinked by an organic peroxide, and one that is crosslinked by ultraviolet rays, but one that is crosslinked by a hydrosilylation reaction is preferred. This hydrosilylation reaction-crosslinkable silicone composition is composed, for example, of (A) an organopolysiloxane having at least two alkenyl groups bonded to silicon atoms per molecule, (B) an organopolysiloxane having at least two hydrogen atoms bonded to silicon atoms per molecule, (C) a silatrane derivative, and (D) a hydrosilylation reaction catalyst.

Component A is the main component of the above hydrosilylation reaction-crosslinkable composition, and is an organopolysiloxane having at least two alkenyl groups bonded to silicon atoms per molecule. Examples of the molecular structure of component A include linear, linear with some branches, branched, and resinous. Examples of the silicon atom-bonded alkenyl groups in component A include vinyl, allyl, butenyl, pentenyl, and hexenyl, with the vinyl group being particularly favorable. The bonding positions of these alkenyl groups in component A may be at the molecular chain terminals, pendant, or both. Examples of silicon atom-bonded groups other than:alkenyl groups in component A include substituted and unsubstituted monovalent hydrocarbon groups such as the methyl, ethyl, propyl, butyl, pentyl, hexyl, heptyl, and other alkyl groups; aryl groups such as phenyl, tolyl, xylyl, and naphthyl, aralkyl groups such as benzyl and phenethyl, and halogenated alkyl groups such as chloromethyl, 3-chloropropyl, and 3,3,3-trifluoropropyl. The methyl group and phenyl group are particularly favorable. It is also preferable for the phenyl group content to be at least 1 mol %, with a range of 1 to 60 mol % being especially good, and a range of 1 to 30 mol % being even better, with respect to the organic groups bonded to silicon atoms in component A. The presence of the phenyl groups provides the resulting silicone adhesive sheet with superior cold resistance and a semiconductor device produced using this silicone adhesive sheet will have better reliability. There are no restrictions on the viscosity of component A, but a range of 10 to 1,000,000 mPa·s at 25° C. is preferable.

Component B of the hydrosilylation reaction-crosslinkable silicone composition is a crosslinking agent and is an organopolysiloxane having at least two hydrogen atoms bonded to silicon atoms per molecule. Examples of the molecular structure of component B include linear, linear with some branches, branched, and resinous. The bonding positions of these hydrogen atoms in component B may be at the molecular chain terminals, pendant, or both. Examples of silicon atom-bonded groups other than hydrogen atoms in component B include substituted and unsubstituted monovalent hydrocarbon groups such as methyl, ethyl, propyl, butyl, pentyl, hexyl, heptyl, and other alkyl groups; aryl groups such as phenyl, tolyl, xylyl, and naphthyl, aralkyl groups such as benzyl and phenethyl, and halogenated alkyl groups such as chloromethyl, 3-chloropropyl, and 3,3,3-trifluoropropyl. The methyl group and phenyl group are particularly favorable. There are no restrictions on the viscosity of component B, but a range of 1 to 100,000 mPa·s at 25° C. is preferable.

Component B should be contained in an amount large enough to cure the above hydrosilylation reaction-crosslinkable composition, which is an amount such that there are between 0.5 and 10 mol of silicon-atom bonded hydrogen atoms per mole of silicon-atom bonded alkenyl groups in the composition. A range of 1 to 5 mol is particularly favorable. This is because curing will tend to be inadequate if the number of moles of silicon-atom bonded hydrogen atoms in the composition per mole of silicon-atom bonded alkenyl groups is below the lower limit of the above range, but if the number of mole is over this range, the heat resistance of the crosslinked product will tend to be lower.

Component C is used to increase the adhesiveness of the crosslinked composition, and examples thereof are the same silatrane derivatives discussed above. Component C should be contained in an amount large enough to impart particularly good adhesiveness to the crosslinked product of the above composition. For example, this amount should be between 0.01 and 20 weight parts per 100 weight parts of component A, and a range of 0.1 to 10 weight parts is particularly favorable. This is because the adhesiveness of the crosslinked product will tend to decrease if component C is contained in an amount below the lower limit of the above range, but there will be no further increase in adhesiveness if the upper limit of the above range is exceeded, and there will actually be a tendency for the stability of the silicone adhesive sheet to decrease.

Component D is a catalyst that is used to promote crosslinking of the hydrosilylation reaction-crosslinkable composition through a hydrosilylation reaction. Examples include platinum-based catalysts, rhodium-based catalysts, palladium-based catalysts, and other known hydrosilylation reaction catalysts. In particular, platinum microparticles, platinum black, platinum carried on silica microparticles, platinum carried on activated charcoal, chloroplatinic acid, an alcohol solution of chloroplatinic acid, an olefin complex of platinum, an alkenylsiloxane complex of platinum, a carbonyl complex of platinum, and other such platinum-based catalysts are preferable because the reaction velocity will be better.

Component D is contained in an amount large enough to promote the crosslinking of the above hydrosilylation reaction-crosslinkable composition. When a platinum catalyst is used, the platinum metal provided by the catalyst to the composition should be between 0.01 and 1000 ppm (weight units), and a range of 0.1 to 500 ppm is particularly favorable. This is because the crosslinking will be much slower if the amount in which component D is contained in the composition is below the lower limit of the above range, but exceeding the upper limit of the above range will not increase the crosslinking rate any further, and may cause problems such as discoloration of the crosslinked product.

It is preferable for the above composition to contain a hydrosilylation reaction inhibitor in order to adjust the hydrosilylation reaction rate. Examples of this hydrosilylation reaction inhibitor include 3-methyl-1-butyn-3-ol, 3,5-dimethyl-1-hexyn-3-ol, phenylbutynol, and other alkyne alcohols; 3-methyl-1-penten-1-yne, 3,5-dimethyl-3-hexen-1-yne, and other -enyne compounds; 1,3,5,7-tetramethyl-1,3,5,7-tetravinylcyclotetrasiloxane, 1,3,5,7-tetramethyl-1,3,5,7-tetrahexenylcyclotetrasiloxane, and benzotriazole. The amount in which this hydrosilylation reaction inhibitor is contained will vary with the conditions under which the above composition is crosslinked, but for practical purposes a range of 0.00001 to 5 weight parts per 100 weight parts of component A is preferable.

Other components can also be added to the above-mentioned composition as needed, examples of which include precipitated silica, wet silica, fumed silica, calcined silica, titanium oxide, alumina, glass, quartz, aluminosilicic acid, iron oxide, zinc oxide, calcium carbonate, carbon black, silicon carbide, silicon nitride, boron nitride, and other such inorganic fillers, as well as inorganic fillers obtained by treating the above fillers with an organohalosilane, organoalkoxysilane, organosilazane, or other such organosilicon compound; silicone resin, epoxy resin, fluororesin, and other such organic resin micropowders; silver, copper, and other such conductive metal powders, and other fillers; as well as dyes, pigments, flame retardants, and solvents.

The method of the present invention for manufacturing a silicone adhesive sheet will now be described in detail. The manufacturing method of the present invention is a method for manufacturing a silicone adhesive sheet for bonding a semiconductor chip to a chip attachment component by subjecting a crosslinkable silicone composition containing a silatrane derivative to a crosslinking reaction between backing materials that do not stick to the crosslinked product of the composition, characterized in that at least one of the backing materials has a larger dielectric constant than that of the crosslinked product. Examples of backing materials that do not stick to the crosslinked product of this crosslinkable silicone composition and have a larger dielectric constant than that of the crosslinked product include metals, metal oxides, and other such inorganic backing materials, and backing materials composed of polyimide resins, polyester resins, polyether resins, polyether sulfone resins, epoxy resins, phenol resins, polyamide resins, and other organic resins. It is particularly favorable for the sides of these backing materials that touch the crosslinkable silicone composition to have oxygen atoms and/or sulfur atoms. The oxygen atoms are preferably atoms that constitute groups selected from the group consisting of carbonyl groups, alkoxy groups, ester groups, and ether groups. The sulfur atoms are preferably atoms that constitute groups selected from the group consisting of sulfone groups and thioether groups. It is preferable for the backing materials that do not stick to the crosslinked product of this crosslinkable silicone composition to be composed of an organic resin. These backing materials may be composed solely of these organic resins, or they may be composite materials having these organic resins on just the surface or in the interior. An example of these composite backing materials is one in which the surface of one of the above organic resins is covered with a fluororesin or other organic resin. There are no restrictions on the shape of these backing materials, but examples include materials in the form of a block, a sheet, or a film. The use of a film-shaped backing material is particularly favorable because it can be used as a protective material for the silicone-based adhesive sheet, and this protective material can be peeled off when the silicone-based adhesive sheet is to be applied to the semiconductor chip and chip attachment component. Instead of this protective material, another film-shaped protective material may be applied. There are no particular restrictions on the dielectric constant of the protective material in this case, but a fluororesin, polyethylene resin, polypropylene resin, or other such organic resin film can be used, for example.

There are no particular restrictions on the crosslinkable silicone composition used in the manufacturing method of the present invention, as long as it contains a silatrane derivative, but examples include one that is crosslinked by a hydrosilylation reaction, one that is crosslinked by a condensation reaction, one that is crosslinked by an organic peroxide, and one that is crosslinked by ultraviolet rays, but one that is crosslinked by a hydrosilylation reaction is preferable. Examples of this hydrosilylation reaction-crosslinkable silicone composition are the compositions listed above, and examples of this silatrane derivative are the compounds listed.

Examples of methods for crosslinking in the present manufacturing include a method in which a crosslinkable silicone composition is crosslinked while sandwiched between the above-mentioned non-stick backing materials, a method in which both sides of a support such as a silicone rubber sheet or an organic resin sheet are coated with the crosslinkable silicone composition and the coatings are then crosslinked while sandwiched between the non-stick backing materials, and a method in which a crosslinkable silicone composition containing silicone rubber particles, organic resin particles, or inorganic particles, or another such filler is crosslinked while sandwiched between the non-stick backing materials.

It is preferable to crosslink the crosslinkable silicone composition after its thickness is adjusted with a double roller, a press, or the like while the crosslinkable silicone composition is sandwiched between the backing materials. To crosslink the crosslinkable silicone composition, for example, it may be left at room temperature or heated at 200° C. or lower.

Figure 1:
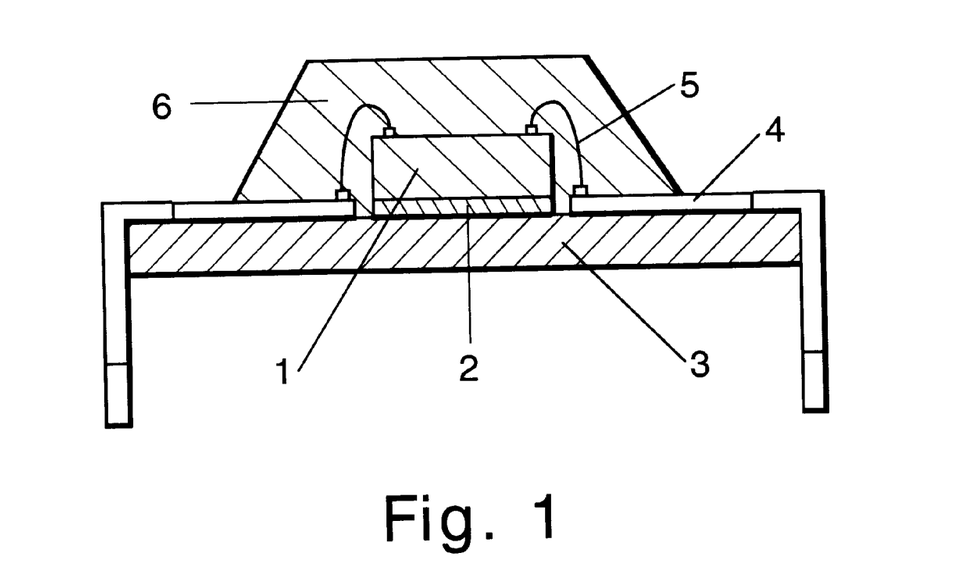
FIG. 1 is a cross section of an example of a semiconductor device (hybrid IC) to which the silicone adhesive sheet of the present invention has been applied.

The silicone adhesive sheet manufactured in this manner is used to bond a semiconductor chip to a chip attachment component. All or part of one side of a semiconductor chip, such as a semiconductor chip in a hybrid IC, or a diode, transistor, thyristor, monolithic IC, or other such device can be bonded to a chip attachment component. The method for using this silicone adhesive sheet to bond a semiconductor chip to a chip attachment component will now be described in detail. FIG. 1 is a cross section of a hybrid IC and FIG. 2 is a cross section of an LSI chip, which are examples of semiconductor devices to which the present silicone adhesive sheet can be applied. The semiconductor device illustrated in FIG. 1 has semiconductor chip 1 bonded to semiconductor chip attachment component 3 (in FIG. 1, a circuit board made of glass fiber-reinforced epoxy resin) by silicone adhesive sheet 2, and semiconductor chip 1 is electrically connected by bonding wire 5 to circuit wiring 4 connected to an external lead. Semiconductor chip attachment component 3 may be formed from a ceramic, glass, epoxy resin, polyimide resin, phenol resin, bakelite resin, melamine resin, glass fiber-reinforced epoxy resin, or the like. Circuit wiring 4 may be formed from gold, copper, aluminum, silver-palladium, indium tin oxide (ITO), or the like. Bonding wire 5 may be formed from gold, copper, or aluminum. Semiconductor element 1 is sealed by sealing resin 6. Examples of the resin that forms sealing resin 6 include epoxy resins, phenol resins, and polyphenylene sulfide resins. In addition to semiconductor chip 1, electronic parts such as resistors, capacitors, and coils may also be mounted on semiconductor chip attachment component 3.

Figure 2:
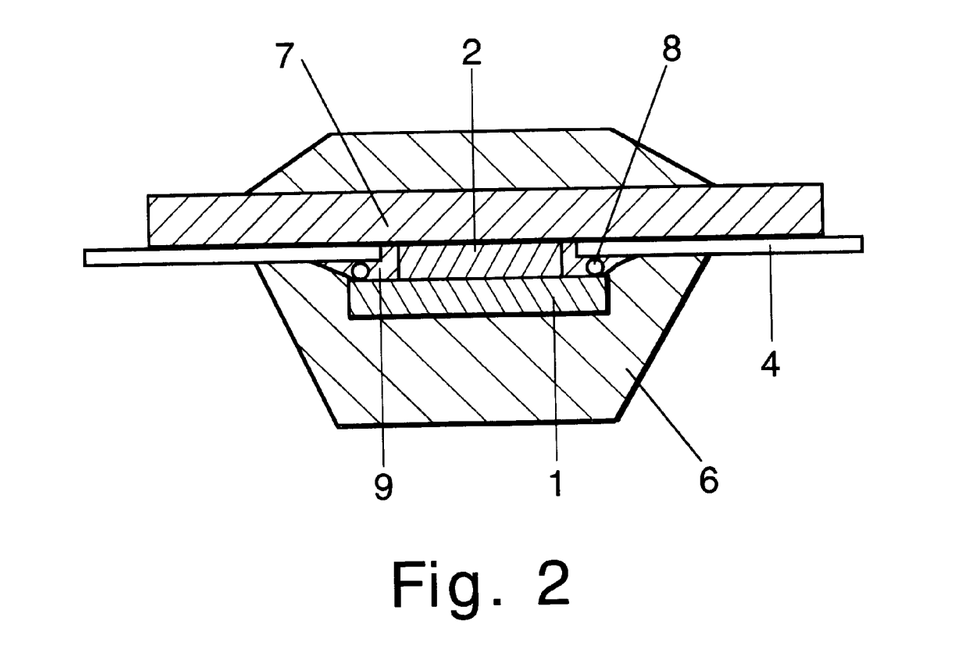
FIG. 2 is a cross section of an example of a semiconductor device (LSI circuit) to which the silicone adhesive sheet of the present invention has been applied.

The semiconductor device illustrated in FIG. 2 has semiconductor chip 1 bonded to chip attachment component 7 (in FIG. 2, a circuit board made of a polyimide resin) by silicone adhesive sheet 2, and semiconductor chip 1 is electrically connected by a bump 8 to circuit wiring 4 on semiconductor chip attachment component 7. Semiconductor chip attachment component 7 may be formed from a polyimide resin, ceramic, glass fiber-reinforced epoxy resin, or the like. Bump 8 may be formed from gold, aluminum, solder, or the like. The area around bump 8 between semiconductor chip 1 and semiconductor chip attachment component 7 may be sealed and filled with a sealant/filler 9. Examples of sealant/filler 9 include a liquid curable silicone resin and a liquid curable epoxy resin. If needed, semiconductor chip 1 may be sealed by sealing resin 6.

The following is an example of a method for bonding a semiconductor chip to a chip attachment component with the above-mentioned silicone adhesive sheet. With the semiconductor device shown in FIG. 1, either a silicone adhesive sheet is stuck to semiconductor chip 1 and the semiconductor chip 1 is then stuck to semiconductor chip attachment component 3 via this sheet, or a silicone adhesive sheet is stuck over semiconductor chip attachment component 3 and semiconductor chip 1 is then stuck to semiconductor chip attachment component 3 via this sheet, and this product is left at room temperature or heated at 200° C. or below. It is preferable here to press the sheet to the components to be bonded to insure adhesion. After this, semiconductor chip 1 is electrically connected to circuit wiring 4 by bonding wire 5. Semiconductor chip 1 is then sealed as needed with sealing resin 6. With the semiconductor device shown in FIG. 2, either the silicone adhesive sheet is stuck to semiconductor chip 1 and semiconductor chip 1 is then stuck to semiconductor chip attachment component 7 via this sheet, or the silicone adhesive sheet is stuck to semiconductor chip attachment component 7 and semiconductor chip 1 is then stuck to semiconductor chip attachment component 7 via this sheet, and this product is left at room temperature or heated at 200° C. or below. It is preferable here to press the sheet to the components to be bonded to insure adhesion. After this, semiconductor chip 1 is electrically connected to circuit wiring 4 by bump 8. The area around bump 8 is then sealed and filled with sealant/filler 9. Semiconductor chip 1 is further sealed as needed with sealing resin 6. Because the present silicone adhesive sheet allows a semiconductor chip to be bonded to a chip attachment component at a relatively low temperature, the semiconductor chip is not damaged by heat, and the reliability of the resulting semiconductor device is higher.

WORKING EXAMPLES

The present silicone adhesive sheet and method for its manufacture will be described through working examples. The viscosity given in the working examples was measured at 25° C. and the dielectric constant of the crosslinked product of the crosslinkable silicone composition was measured at 25° C. and 1 MHz. The adhesiveness of the silicone adhesive sheet was evaluated as follows. A silicon wafer (3×3 cm) and an epoxy resin sheet (3×3 cm) were stuck together with a silicone adhesive sheet (1×1 cm) between them, after which a force of 5 kgf/cm$^2$ was applied to this assembly while it was heated for 10 minutes at 100° C., which produced a bonded test piece. The silicon wafer and the epoxy resin sheet of the bonded test piece thus obtained were tested by being pulled in opposite directions, the proportion (%) of the test piece surface area that underwent cohesive failure was determined, and this was used as an index of adhesion. A bonded test piece produced in the same manner as above, except that the heating was for 30 minutes at 150° C., was similarly evaluated for adhesion.

Reference Example 1

12.2 g (0.2 mol) Of 2-hydroxyethylamine, 88.9 g (0.6 mol) of vinyltrimethoxysilane, 94.5 g (0.4 mol) of 3-glycidoxypropyltrimethoxysilane, and 32.0 g of methanol were put into a 500 mL four-neck flask equipped with an agitator, a thermometer, and a reflux condenser. This system was heated and stirred for 8 hours at the reflux temperature of methanol. The entire quantity of the reaction mixture was transferred to a flask and the low-boiling component was distilled off by rotary evaporation, yielding 132 g of a faintly yellow, translucent liquid. This translucent liquid was subjected to $^{29}$Si-NMR (nuclear magnetic resonance) analysis and $^{13}$C-NMR analysis, which confirmed that a silatrane derivative described by the following formula was contained in an amount of at least 90 wt %.

Reference Example 2

148.2 g (1.0 mol) Of vinyltrimethoxysilane, 141.8 g (0.6 mol) of 3-glycidoxypropyltrimethoxysilane, and 64.0 g of methanol were put into a 500 mL four-neck flask equipped with an agitator, a thermometer, and a reflux condenser. This system was heated and stirred at the reflux temperature of methanol. The system was then heated under reflux for 24 hours while ammonia gas was sprayed in for 2 minutes every hour at a rate of 50 mL/min. The entire quantity of the reaction mixture was transferred to a flask and the low-boiling component was distilled off by rotary evaporation yielding 152.1 g of a faintly yellow, translucent liquid. This translucent liquid was subjected to $^{29}$Si-NMR analysis and $^{13}$C-NMR analysis, which confirmed that a silatrane derivative described by the following formula was contained in an amount of at least 90 wt %.

0.01 weight part 3-phenyl-1-butyn-3-ol were uniformly mixed into 100 weight parts of the above-mentioned silicone rubber base to prepare a hydrosilylation reaction-crosslinkable silicone composition with a viscosity of 70,000 mPa·s.

This crosslinkable silicone composition was sandwiched between polyether sulfone resin films (thickness: 100 μm,

Reference Example 3

12.2 g (0.2 mol) Of 2-hydroxyethylamine, 125.0 g (0.2 mol) of tetraethoxysilane, 111.4 g (0.4 mol) of 3-glycidoxypropyltriethoxysilane, and 30.0 g of ethanol were put into a 500 mL four-neck flask equipped with an agitator, a thermometer, and a reflux condenser. This system was heated and stirred for 15 hours at the reflux temperature of ethanol. The entire quantity of the reaction mixture was transferred to a flask and the low-boiling component was distilled off by rotary evaporation yielding 134.5 g of a faintly yellow, translucent liquid. This translucent liquid was subjected to $^{29}$Si-NMR analysis and 13C-NMR analysis, which confirmed that a silatrane derivative described by the following formula was contained in an amount of at least 90 wt %.

dielectric constant: 3.5) having sulfur atoms (the sulfur atoms in the sulfone groups) chemically bonded on its surface, and this product was subjected to a crosslinking reaction by being heated for 30 minutes in an 80° C. hot air circulating oven in a state in which the thickness of the crosslinkable silicone composition had been reduced to 200 μm by passing through a stainless steel double roller, thereby preparing a silicone adhesive sheet. This silicone adhesive sheet was easy to peel away from the polyether sulfone resin sheets, and had an even thickness of about 200 μm and a dielectric constant of 2.8. Table 1 shows the adhesiveness of this silicone adhesive sheet.

Working Example 2

A silicone adhesive sheet was produced in the same manner as in Working Example 1, except that the silatrane

Working Example 1

72 Weight parts of a dimethylvinylsiloxy end-capped dimethylpolysiloxane (vinyl group content=0.08 wt %) having a viscosity of 40,000 mPa·s, 15 weight parts of a dimethylvinylsiloxy end-capped dimethylsiloxane methylvinylsiloxane copolymer (vinyl group content=0.84 wt %) having a viscosity of 6000 mPa·s, 3 weight parts hexamethyldisilazane, and particulate fumed silica with a BET specific surface area of 200 m²/g were mixed for 1 hour in a Ross mixer, after which they were mixed for another 2 hours at 170° C. under reduced pressure. The system was then cooled to room temperature to prepare a semi-transparent, paste-form silicone rubber base.

Then, 3 weight parts of a trimethylsiloxy end-capped dimethylsiloxane·methylhydrogensiloxane copolymer (silicon atom-bonded hydrogen atom content=0.7 wt %) having a viscosity of 5 mPa·s, 1.0 weight part of the silatrane derivative prepared in Reference Example 1, a 1,3-divinyl-1,1,3,3-tetramethyldisiloxane complex of platinum (with this composition, in an amount such that there would be 5 ppm platinum metal in this complex as weight units), and derivative prepared in Reference Example 2 was added in the same amount instead of the silatrane derivative prepared in Reference Example 1. The silicone adhesive sheet obtained was easy to peel away from the polyether sulfone resin sheets, and had an even thickness of about 200 μm and a dielectric constant of 2.8. Table 1 shows the adhesiveness of this silicone adhesive sheet.

Working Example 3

A silicone adhesive sheet was produced in the same manner as in Working Example 1, except that the silatrane derivative prepared in Reference Example 3 was added in the same amount instead of the silatrane derivative prepared in Reference Example 1. The silicone adhesive sheet obtained was easy to peel away from the polyether sulfone resin sheets, and had an even thickness of about 200 μm and a dielectric constant of 2.8. Table 1 shows the adhesiveness of this silicone adhesive sheet.

Comparative Example 1

A silicone adhesive sheet was produced in the same manner as in Working Example 1, except that the silatrane derivative prepared in Reference Example 1 was not added. The silicone adhesive sheet thus obtained was easy to peel away from the polyether sulfone resin sheets, and had an even thickness of about 200 μm and a dielectric constant of 2.8. Table 1 shows the adhesiveness of this silicone adhesive sheet.

Comparative Example 2

A silicone adhesive sheet was produced in the same manner as in Working Example 1, except that a 1:1 (weight ratio) mixture of 3-glycidoxypropyltrimethoxysilane and a dimethylhydroxy end-capped methylvinylpolysiloxane (vinyl group content=31 wt %) having a viscosity of 40 mPa·s was added in the same amount instead of the silatrane derivative prepared in Reference Example 1. The silicone adhesive sheet thus obtained was easy to peel away from the polyether sulfone resin sheets, and had an even thickness of about 200 μm and a dielectric constant of 2.8. Table 1 shows the adhesiveness of this silicone adhesive sheet.

Comparative Example 3

A silicone adhesive sheet was prepared in the same manner as in Working Example 1, except that an organosiloxane (vinyl group content=16 wt %) with a viscosity of 20 mPa·s described by the following average unit formula was added in the same amount instead of the silatrane derivative prepared in Reference Example 1. The silicone adhesive sheet thus obtained was easy to peel away from the polyether sulfone resin sheets, and had an even thickness of about 200 μm and a dielectric constant of 2.8. Table 1 shows the adhesiveness of this silicone adhesive sheet.

3. A silicone adhesive sheet as defined in claim 1, where the silatrane derivative is a compound described by formula:

where each $R^1$ is independently selected from the group consisting of a hydrogen atom and an alkyl group; each $R^2$ is independently selected from the group consisting of a hydrogen atom, alkyl groups, and alkoxysilyl-containing organic groups described by formula $-R^4-Si(OR^5)_xR^6{}_{(3-x)}$, where $R^4$ is a divalent organic group, $R^5$ is a $C_1$ to $C_{10}$ alkyl group, $R^6$ is a substituted or unsubstituted monovalent hydrocarbon group, and x is 1, 2, or 3, at least one of the $R^2$ groups is an alkoxysilyl-containing organic group, and $R^3$ is selected from the group consisting of substituted and unsubstituted monovalent hydrocarbon groups, $C_1$ to $C_{10}$ alkoxy groups, glycidoxyalkyl groups, oxiranylalkyl groups, and acyloxyalkyl groups.

4. A silicone adhesive sheet as defined in claim 3, where $R^3$ is selected from the group consisting of an alkenyl group of an alkoxy group.

5. A silicone adhesive sheet as defined in claim 1, where the silatrane derivative is contained in an amount of 1.01 to

TABLE 1

$(CH2CHCH_2O(CH_2)_3SiO_{3/2})_{0.18}[(CH_3)(CH_2=CH))SiO_{2/2}]_{0.47}(CH_3O_{1/2})_{0.35}$

| Adhesiveness | Working Ex. 1 | Working Ex. 2 | Working Ex. 3 | Comp. Ex. 1 | Comp. Ex. 2 | Comp. Ex. 3 |
|---|---|---|---|---|---|---|
| After 10 Min. of heating at 100° C. | | | | | | |
| Silicon wafer | 100% | 100% | 100% | 0% | 80% | 90% |
| Epoxy resin sheet | 100% | 100% | 90% | 0% | 20% | 40% |
| After 30 Min. of heating at 150° C. | | | | | | |
| Silicon wafer | 100% | 100% | 100% | 10% | 100% | 100% |
| Epoxy resin sheet | 100% | 100% | 100% | 0% | 100% | 100% |

We claim:

1. A silicone adhesive sheet for bonding a semiconductor chip to a chip attachment component comprising a crosslinked product of a crosslinkable silicone composition comprising a silatrane derivative.

2. A silicone adhesive sheet as defined in claim 1 where the exterior sides are formed from the crosslinked product of a crosslinkable silicone composition comprising a silatrane derivative and the interior is formed from a silicone rubber composition that does not contain the silatrane derivative.

20 weight parts per 100 weight parts of polyorganosiloxane comprising the main component of the crosslinkable silicone composition.

6. A silicone adhesive sheet as defined in claim 1, where the crosslinkable silicone composition is crosslinked by a hydrosilylation reaction.

7. A method for manufacturing a silicone adhesive sheet for bonding a semiconductor chip to a chip attachment comprising effecting crosslinking of a crosslinkable silicone composition containing a silatrane derivative between backing materials that do not stick to crosslinked product of the composition where at least one of the backing materials has a larger dielectric constant than that of the crosslinked product.

8. A method for manufacturing a silicone adhesive sheet as defined in claim 7, where the silatrane derivative is a compound described by formula:

where each $R^1$ is independently selected from the group consisting of a hydrogen atom and an alkyl group; each $R^2$ is independently selected from the group consisting of a hydrogen atom, alkyl groups, and alkoxysilyl-containing organic groups described by formula —$R^4$—$Si(OR^5)_x R^6_{(3-x)}$, where $R^4$ is a divalent organic group, $R^5$ is a $C_1$ to $C_{10}$ alkyl group, $R^6$ is a substituted or unsubstituted monovalent hydrocarbon group; and x is 1, 2, or 3, at least one of the $R^2$ groups is an alkoxysilyl-containing organic group, and $R^3$ is selected from the group consisting of substituted and unsubstituted monovalent hydrocarbon groups, $C_1$ to $C_{10}$ alkoxy groups, glycidoxyalkyl groups, oxiranylalkyl groups, and acyloxyalkyl groups.

9. A method for manufacturing a silicone adhesive sheet as defined in claim 8, where $R^3$ is selected from the group consisting of an alkenyl group and an alkoxy group.

10. A method for manufacturing a silicone adhesive sheet as defined in claim 7, where the silatrane derivative is contained in an amount of 0.01 to 20 weight parts per 100 weight parts of organopolysiloxane comprising the main component of the crosslinkable silicone composition.

11. A method for manufacturing a silicone adhesive sheet as defined in claim 7, where the crosslinkable silicone composition is crosslinked by a hydrosilylation reaction.

12. A method for manufacturing a silicone adhesive sheet as defined in claim 7, where at least one of the backing materials comprises on the side touching the crosslinkable silicone composition atoms selected from the group consisting of oxygen and sulfur.

13. A method for manufacturing a silicone adhesive sheet as defined in claim 12, where the oxygen atoms are substituents of groups selected from the group consisting of carbonyl groups, alkoxy groups, ester groups, and ether groups.

14. A method for manufacturing a silicone adhesive sheet as defined in claim 12, where the sulfur atoms are substituents of groups selected from the group consisting of sulfone groups and thioether groups.

* * * * *